United States Patent [19]

Lee et al.

[11] Patent Number: 5,543,361
[45] Date of Patent: *Aug. 6, 1996

[54] PROCESS FOR FORMING TITANIUM SILICIDE LOCAL INTERCONNECT

[75] Inventors: Steven S. Lee; Kenneth P. Fuchs; Gayle W. Miller, all of Colorado Springs, Colo.

[73] Assignees: AT&T Global Information Solutions Company, Dayton, Ohio; Hyundai Electronics America, Milpitas, Calif.; Symbios Logic Inc., Fort Collins, Colo.

[*] Notice: The term of this patent shall not extend beyond the expiration date of Pat. No. 5,443,996.

[21] Appl. No.: 351,843

[22] Filed: Dec. 8, 1994

Related U.S. Application Data

[63] Continuation of Ser. No. 522,775, May 14, 1990, Pat. No. 5,443,996.
[51] Int. Cl.$^6$ .................................................. H01L 21/44
[52] U.S. Cl. .................. 437/200; 437/201; 148/DIG. 15; 148/DIG. 19; 148/DIG. 147
[58] Field of Search ........................... 437/200, 196, 437/195, 201; 148/DIG. 15, DIG. 147, DIG. 19

[56] References Cited

U.S. PATENT DOCUMENTS

| | | | |
|---|---|---|---|
| 4,589,196 | 5/1986 | Anderson | 148/DIG. 147 |
| 4,641,417 | 2/1987 | McDavid | 156/656 |
| 4,690,730 | 9/1987 | Tang et al. | 437/200 |
| 4,746,219 | 5/1988 | Holloway et al. | 437/200 |
| 4,751,198 | 6/1988 | Anderson | 437/200 |
| 4,777,150 | 10/1988 | DeNeuville et al. | 437/200 |
| 4,870,033 | 9/1989 | Hotta et al. | 437/200 |
| 4,873,204 | 10/1989 | Wong et al. | 437/200 |
| 4,886,764 | 12/1989 | Miller et al. | 437/200 |
| 4,904,620 | 2/1990 | Scmmitz | 437/200 |
| 4,923,822 | 5/1990 | Wang et al. | 437/200 |
| 4,994,402 | 2/1991 | Chiu | 437/200 |
| 5,001,082 | 3/1991 | Goodwin-Johansson | 437/200 |

FOREIGN PATENT DOCUMENTS

| | | | |
|---|---|---|---|
| 60-167354 | 8/1985 | Japan | 148/DIG. 19 |
| 60-182133 | 9/1985 | Japan | 148/DIG. 19 |

OTHER PUBLICATIONS

J. F. Jongste, et al., Appl. Surf. Sci., 38 (1989) 57 "Formation of TiSi$_2$ in a Nitrogen Ambient".

Translation of JP 60–167354 cited in a prior action.

Y. Koh et al., J. Vac. Sci. and Technol., B3, 6 (1985) 1715 "Self Aligned TiSi$_2$ For Bipolar Applications".

S. Wolf, "Silicon Processing For The VLSIEAR" vol. II, 1990, pp. 162–169, 172–173.

M. T. Lin et al., J. Electrochem Soc., 133, 11 (1986) 2386 "Trilayer Structure For TiSi$_2$ Formation".

*Primary Examiner*—Tom Thomas
*Assistant Examiner*—Leon Radomsky
*Attorney, Agent, or Firm*—Wayne P. Bailey; Douglas S. Foote

[57] ABSTRACT

A process for forming a titanium silicide local interconnect between electrodes separated by a dielectric insulator on an integrated circuit. A first layer of titanium is formed on the insulator, and a layer of silicon is formed on the titanium. The silicon layer is masked and etched to form a silicon strip connecting the electrodes, and an overlying second layer of titanium is formed over the silicon strip. The titanium and silicon are heated to form nonsilicidized titanium over a strip of titanium silicide, and the nonsilicidized titanium is removed.

27 Claims, 4 Drawing Sheets

5,543,361

PROCESS FOR FORMING TITANIUM SILICIDE LOCAL INTERCONNECT

This is a continuation of application Ser. No. 07/522,775, filed May 14, 1990, now U.S. Pat. No. 5,443,996.

The present invention relates to a process for forming an electrical connection between active regions on an integrated circuit. More particularly, it relates to a process for forming a titanium silicide local interconnect.

BACKGROUND OF THE INVENTION

Integrated circuit designs have numerous active devices such as transistors laid out on a common substrate, typically silicon. In order to prevent electrical interference between the active devices, they are separated by isolation regions. Such isolation regions may be formed early in the fabrication process by masking the active regions and growing an insulator such as oxide in the nonmasked isolation regions. The grown oxide, referred to as field oxide, serves both to isolate and define the active regions. The active devices are formed by various processing steps and then covered with an insulator. In order to interconnect the various active devices, one or more overlying metalization layers are formed on top of the insulator with connections to the devices provided by openings in the insulator.

The development of integrated circuits has been characterized by the ever increasing number of devices placed on a single semiconductor substrate. In order to achieve higher device density, smaller geometry devices have been developed. One limitation to device dimensions is the minimum contact area or "footprint" required between metalization layers and active devices. In order to overcome this limitation, interconnections between adjacent active devices may be disposed underneath the insulating layer. Such interconnections, known as "local interconnects," are formed on top of the isolating field oxide and prior to the formation of overlying insulating and metalization layers.

A local interconnect formed between two active regions will typically connect a source/drain region of one active region to the source/drain region of the other. However, local interconnects may also be formed between polysilicon gate regions and between a polysilicon gate region and source/drain region. In general, local interconnects are used to connect electrodes of active devices.

Local interconnects do not eliminate the need for metalization layers. However, they do reduce some of the complexity of the metalization layers. In addition, the connection between a metalization layer and active device may be made by connecting the metalization layer to the local interconnect. Since the local interconnect may overlay the field oxide region, a relatively large area is available for the required connection. This permits the active device dimensions to be reduced.

Local interconnects are not generally made of the same metal as the metalization layers. The integrated circuit is subjected to relatively high temperatures during the formation of active devices. As these temperatures are sufficient to degrade typical metalization elements, a more stable conductor such as titanium silicide is typically used.

One process for producing local interconnect involves heating a layered strip of titanium and silicon to form a strip of titanium silicide. The heating also produces a layer of titanium nitride on the sidewalls of the titanium silicide strip which must be selectively removed. The titanium silicide is then subjected to a high temperature annealing. A problem with this process is that during the sidewall formation of titanium nitride some of the titanium in the layered strip is consumed. Thus, when the titanium nitride is removed the sidewalls are undercut. The degree of undercut is difficult to control, and the resulting local interconnect has a variable cross sectional area. Thus, the electrical resistance of the local interconnect, which is proportional to the cross sectional area, is unpredictable. In addition, the undercut can create voids when the insulating oxide is applied. Such voids can result in reliability problems, such as stress fractures.

OBJECTS OF THE INVENTION

It is therefore an object of the present invention to provide a new and improved process for forming a metal silicide strip.

It is another object of the present invention to provide a new and improved process for forming a local interconnect between electrodes of an integrated circuit.

It is a further object of the present invention to provide a process for forming a local interconnect having predictable dimensions.

It is yet another object of the present invention to provide a process for forming a local interconnect on an integrated circuit which reduces the susceptibility of the integrated circuit to cracking.

SUMMARY OF THE INVENTION

One form of the present invention is a process for forming a titanium silicide local interconnect between electrodes separated by a dielectric insulator on an integrated circuit. A first layer of titanium is formed, and a layer of silicon is formed on the titanium. The silicon layer is masked and etched to form a silicon strip connecting the electrodes, and an overlying second layer of titanium is formed over the silicon strip. The titanium and silicon are heated to form nonsilicidized titanium over a strip of titanium silicide, and the nonsilicidized titanium is removed.

DESCRIPTION OF A PREFERRED EMBODIMENT

Figure 1:
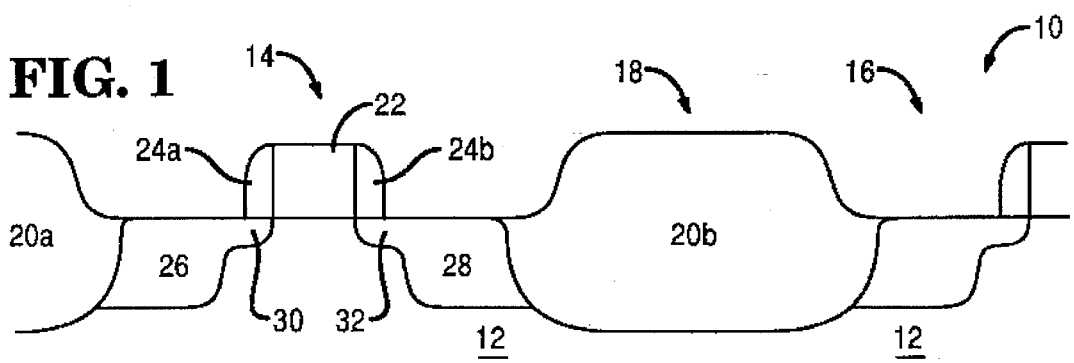
FIGS. 1–4 are schematic cross-sectional views of a portion of an integrated circuit taken sequentially during selected processing steps according to the forms of the present invention shown in FIGS. 5A–5F.

Referring to FIG. 1, an early stage of the formation of a portion of an integrated circuit 10 is shown. Circuit 10 includes a single crystal silicon substrate 12 of either n or p type. Active regions are designated generally as 14 and 16. Active regions 14 and 16 are separated by an isolation region 18. Isolation region 18 consists of field oxide region 20b. Also shown is field oxide region 20a which together with field oxide region 20b isolates and defines active region 14. Field oxide regions 20a and 20b are formed according to any of a number of conventional processes. For example, a local oxidation of silicon (LOCOS) process may be employed wherein active regions are masked and field oxide grown in the isolation regions. Active region 14 shows the formation of a MOSFET having a gate 22 with oxide sidewalls 24a and 24b. Gate 22 overlies substrate 12 and defines source/drain regions 26 and 28. Sidewalls 24a and 24b of gate 22 overlie lightly doped source/drain regions 30 and 32.

The upper contact surface of gate 22 is referred to herein as the gate electrode and the upper contact surface of source/drain regions 26 and 28 are referred to herein as source/drain electrodes. The inventive process involves the formation of local interconnect between electrodes separated by a dielectric insulator. For example, the following description is directed to the formation of local interconnect between source/drain electrodes separated by field oxide region 20b. However, the invention is not limited to the formation of local interconnect between source/drain electrodes. It includes the formation of local interconnect between a gate electrode and source/drain electrode separated by a dielectric insulator such as oxide sidewall 24a or 24b. It also includes the formation of local interconnect between gate electrodes separated by a field oxide.

Figure 2:
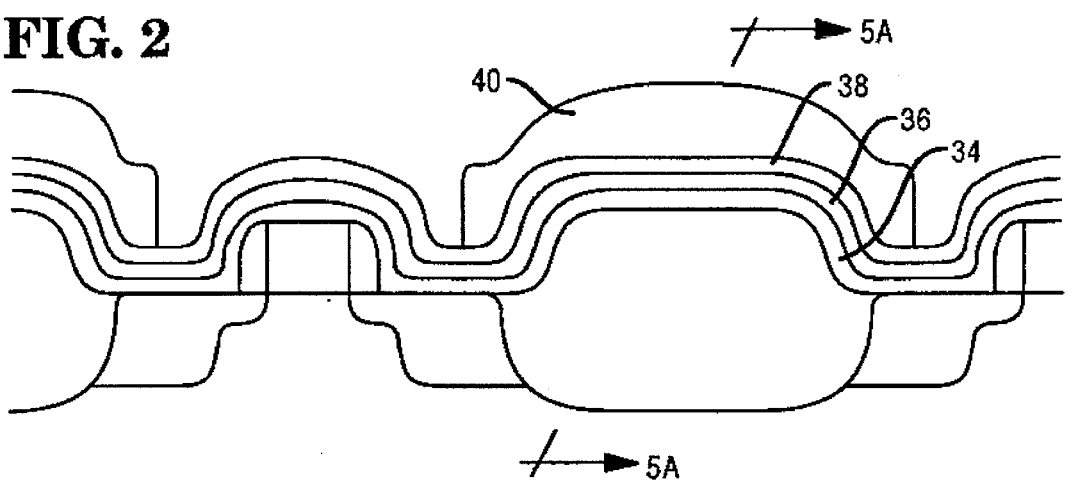
Figure 5A:
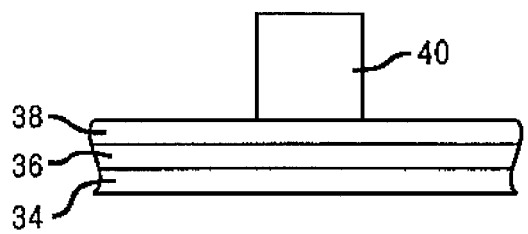
FIGS. 5A–5F are schematic cross-sectional views of local interconnect formation taken sequentially during selected processing steps according to one form of the present invention.
Figure 5B:
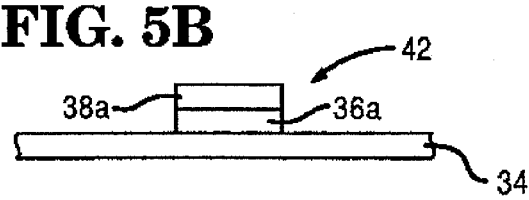
Figure 5C:
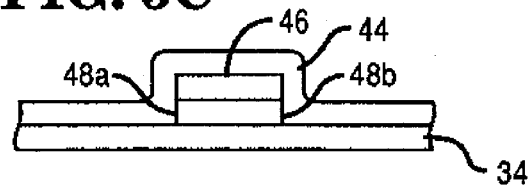

FIG. 2 is best viewed together with FIGS. 5A and 5B. A metal layer 34 is formed by a conventional sputtering process or the like. Preferably, the metal for layer 34 is a transition metal such as titanium, cobalt, platinum, palladium, molybdenum, tantalum or nickel. In a preferred embodiment the metal is titanium. Layer 34 is deposited on both the active regions 14 and 16 as well as isolation region 18. FIG. 5A shows a cross sectional view of a portion of isolation region 18 taken along line 5A—5A in FIG. 2. Silicon is deposited by a chemical vapor deposition (CVD) process or sputtered on metal layer 34 to form a silicon layer 36 on the metal. Preferably, the silicon is an amorphous silicon. An oxide layer 38 may be deposited on silicon layer 36 by a CVD process. A photoresist mask 40 is applied to define the local interconnect pattern connecting active regions 14 and 16. Referring to FIG. 5B, the oxide layer 38 and silicon layer 36 are etched using metal layer 34 as an etch stop. This forms an interconnect strip 42 of silicon 36a capped with oxide 38a which connects active regions 14 and 16. The remaining photoresist 40 is removed. As shown in FIG. 5C, an overlying second metal layer 44 is formed over metal 34 and interconnect strip 42. Metal 44 covers both the top 46 and substantially vertical sidewalls 48a and 48b of strip 42.

Figure 3:
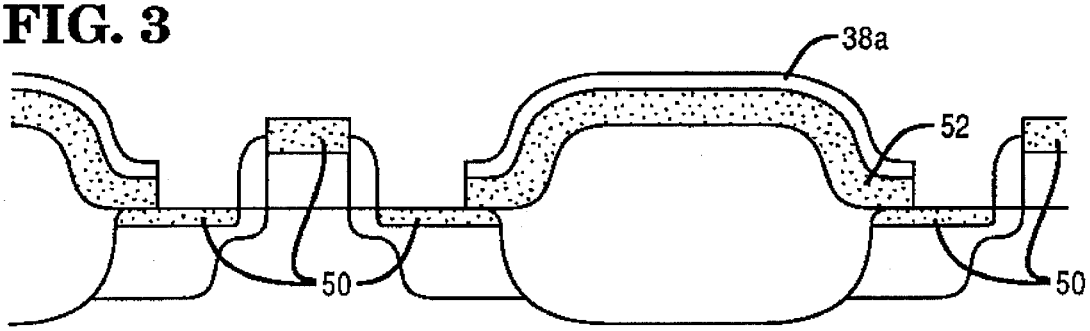
Figure 5D:
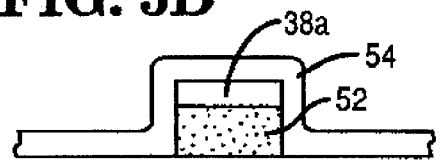
Figure 5E:

FIG. 3 shows a view of integrated circuit 10 after a low temperature anneal and a selective etch. Rapid thermal process (RTP) of device 10 requires about 600 degrees C. or higher for at least 10 seconds, with preferred values of about 650 degrees C. for 60 seconds. Heating in a furnace requires about 580 degrees C. or higher for at least 10 minutes. Circuit 10 is heated in the presence of nitrogen or a combination of nitrogen and argon or ammonia. Wherever metal overlies silicon, metal silicide layers 50 are formed. Layers 50 in active regions 14 and 16 are covered by an overlying nonsilicidized layer of metal nitride, metal nitride oxide or nonreacted metal. Similarly, the low temperature anneal also forms a metal silicide strip 52, shown in FIG. 5D, on isolation region 18. The oxide cap 38a is generally not affected. However, metal layer 44 may react, in whole or in part, with the nitrogen or other atmospheric elements present during the low temperature annealing to form a nonsilicidized layer 54 such as metal nitride, metal nitride oxide or nonreacted metal. Layer 54 is then removed, as shown in FIG. 5E, by a selective etch utilizing a mixture such as $H_2SO_4$ and $H_2O_2$ or $NH_4OH$ and $H_2O_2$.

Figure 4:
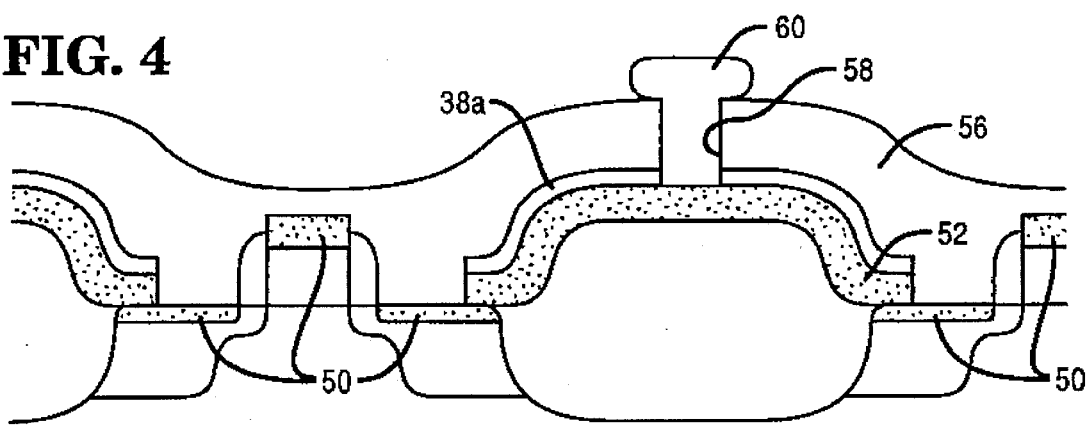
Figure 5F:
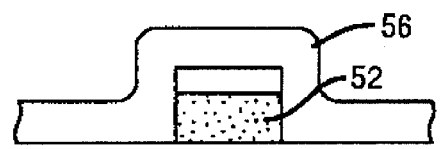

Integrated circuit 10 is then reheated to a temperature greater than 680 degrees C., to stabilize metal silicide strip 52. After this high temperature annealing, an electrically insulating layer 56, shown in FIGS. 4 and 5F, is formed over the surface of integrated circuit 10, including the oxide capped metal silicide strip 52. In a preferred embodiment, insulating layer 56 is a phosphosilicate glass (PSG), boron phosphosilicate glass (BPSG), or undoped glass. Conventional lithographic and etching techniques are used to open a window 58 in insulating layer 56 and oxide cap 38a. An overlying metalization layer 60 is then formed on top of insulating layer 56 and in window 58 to provide electrical contact to metal silicide 52.

Because the sidewalls of metal silicide strip 52 are substantially vertical, and not undercut, glass 56 will adhere to the sidewalls when applied. This prevents the formation of any voids which could otherwise result the reliability problems. It will be also be noted that the extra metal layer 44 prevents metal 34 underneath silicon 36a from reacting with anything other than silicon 36a. This allows the dimensions of metal silicide strip 52 to be accurately predicted and controlled.

Figure 6A:
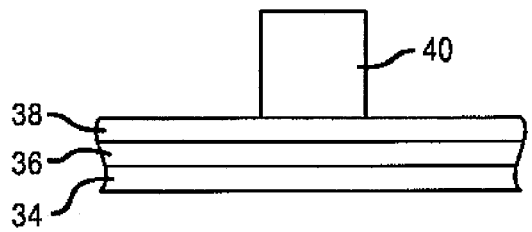
FIGS. 6A–6F are schematic cross-sectional views of local interconnect formation taken sequentially during selected processing steps according to another form of the present invention.
Figure 6B:
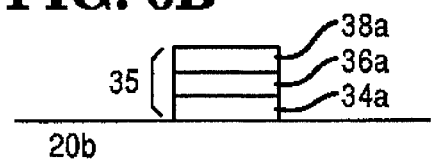
Figure 6C:
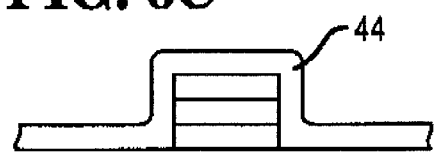
Figure 6D:
Figure 6E:
Figure 6F:
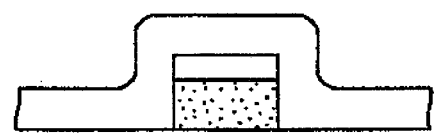

FIGS. 6A–6F show a sequence of processing steps according to another form of the present invention. The views are similar to those in FIGS. 5A–5F. FIG. 6A shows the formation of metal layer 34, silicon layer 36 and oxide layer 38. After masking the interconnect with photoresist 40, an etch of layers 38, 36 and 34 is performed, as shown in FIG. 6B. Field oxide 20b serves as the etch stop on the isolation region. This forms a layered strip 35 including metal strip 34a and silicon strip 36a and topped by oxide cap 38a. The top and substantially vertical sidewalls of layered strip 35 are then covered with metal layer 44, as shown in FIG. 6C. A low temperature annealing of the metal covered strip 35 yields an oxide capped metal silicide strip 52 covered with nonsilicidized metal 54, as shown in FIG. 6D. The process resulting in the structure shown in FIGS. 6E and 6F is the same as described above with respect to FIGS. 5E and 5F.

Figure 7A:
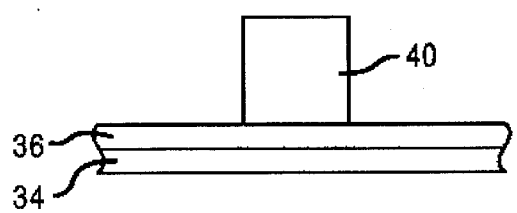
FIGS. 7A–7F are schematic cross-sectional views of local interconnect formation taken sequentially during selected processing steps according to yet another form of the present invention.
Figure 7B:
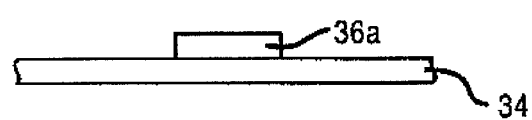
Figure 7C:
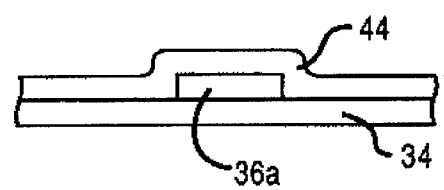
Figure 7D:
Figure 7E:
Figure 7F:
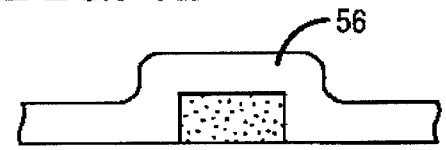

FIGS. 7A–7F show a sequence of processing steps according to another form of the present invention. The views are similar to those in FIGS. 5A–5F. FIG. 7A shows the formation of metal layer 34 and silicon layer 36. Unlike the FIG. 5A and 6A embodiments, no overlying oxide layer is formed. Silicon layer 36 is masked with photoresist 40 and etched to form a silicon strip 36a, as shown in FIG. 7B. An overlying layer of metal 44 is applied, as shown in FIG. 7C. A low temperature annealing of the metal covered strip 36a yields a metal silicide strip 52 covered with nonsilicidized metal 54, as shown in FIG. 7D. The process resulting in the structure shown in FIGS. 7E and 7F is the same as described above with respect to FIGS. 5E and 5F. Of course, metal silicide strip 52 does not have an oxide cap, so contact with metalization layer 60 is accomplished by opening a window in insulating layer 56.

Figure 8A:
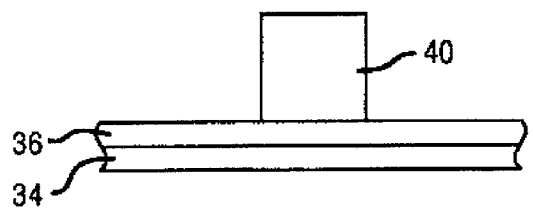
FIGS. 8A–8F are schematic cross-sectional views of local interconnect formation taken sequentially during selected processing steps according to still another form of the present invention.
Figure 8B:
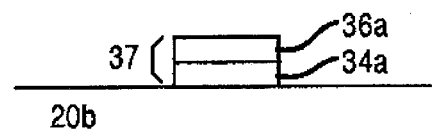
Figure 8C:
Figure 8D:
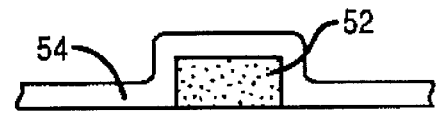
Figure 8E:
Figure 8F:
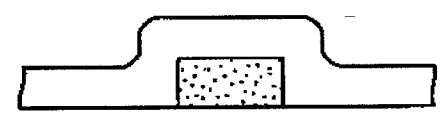

FIGS. 8A–8F show a sequence of processing steps according to another form of the present invention. The views are similar to those in FIGS. 5A–5F. FIG. 8A shows the formation of metal layer 34 and silicon layer 36. After masking silicon layer 36 with photoresist 40, an etch of layers 36 and 34 is performed, as shown in FIG. 8B. Field oxide 20b serves as the etch stop on the isolation region. This forms a layered strip 37 including metal strip 34a and silicon strip 36a. The top and substantially vertical sidewalls of layered strip 37 are then covered with metal layer 44, as shown in FIG. 8C. A low temperature annealing of the metal covered strip 37 yields a metal silicide strip 52 covered with nonsilicidized metal 54, as shown in FIG. 8D. The process resulting in the structure shown in FIGS. 8E and 8F is the same as described above with respect to FIGS. 7E and 7F.

Figure 9A:
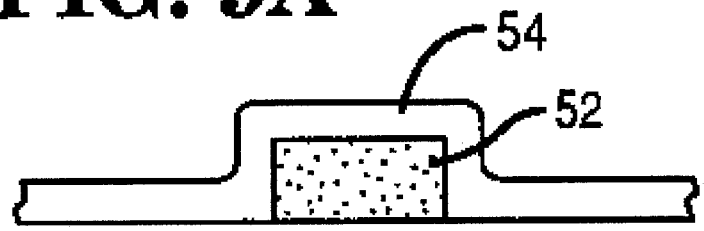
FIGS. 9A–9D are schematic cross-sectional views of local interconnect formation taken sequentially during selected processing steps according to a further form of the present invention.
Figure 9B:
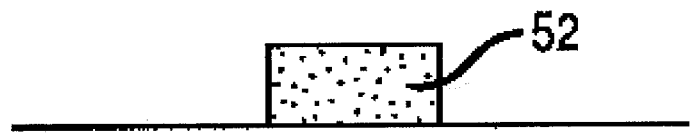
Figure 9C:
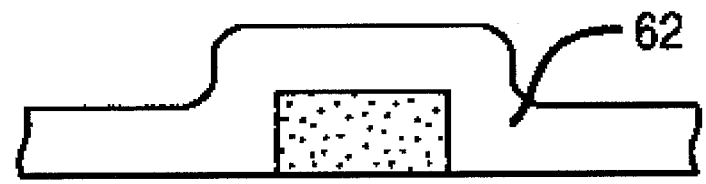
Figure 9D:
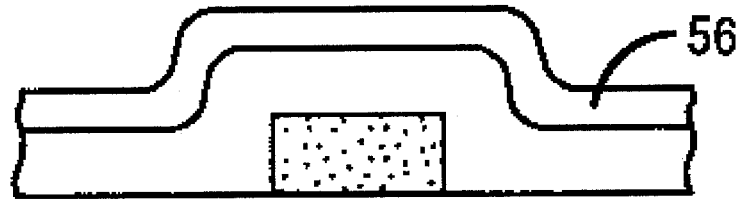

FIGS. 9A–9D show a sequence of processing steps whereby a CVD oxide is formed after the removal of nonsilicidized metal 54 but prior to high temperature annealing of metal silicide 52. FIG. 9A is a view similar to that shown in FIG. 7D or 8D with the device having been processed according to steps 7A–7D or 8A–8D, respectively. As shown in FIG. 9B, nonsilicidized metal 54 is removed by a selective etch to expose nonstabilized metal silicide strip 52. Prior to subjecting the device to a high temperature anneal, metal silicide strip 52 is covered with oxide layer 62 by CVD deposition, FIG. 9C. The device is now subjected to a high temperature annealing to stabilize metal silicide 52. An electrically insulating layer 56 of PSG or BPSG is then formed over the entire surface, as shown in FIG. 9D. This process variation prevents oxidation of metal silicide 52 during its high temperature annealing. It also eliminates dopant outdiffusion from active areas of integrated circuit 10.

Preferred thickness ranges for the various layers are as follows:

metal layers 34 and 44: 5–200 nm silicon layer 36: 10–400 nm oxide layers 38 and 62: at least 2 nm It will be clear to those skilled in the art that the present invention is not limited to the specific embodiments disclosed and illustrated herein. It will be understood that the dimensions and proportional and structural relationships shown in the drawings are illustrated by way of example only and these illustrations are not to be taken as the actual dimensions or proportional structural relationships used in the process of the present invention.

It will be understood that the dimensions and proportional and structural relationships shown in the drawings are illustrated by way of example only. These illustrations are not to be taken as the actual dimensions or proportional structural relationships used in the inventive process for forming titanium silicide local interconnect.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A process for forming a metal silicide local interconnect between contact points separated by a dielectric insulator on an integrated circuit comprising:

forming a first layer of metal on said insulator;

forming a layer of silicon on said metal;

masking and etching said silicon layer to form a silicon strip connecting said contact points, wherein said silicon strip includes a top and substantially vertical sidewalls;

forming an overlying second layer of metal, wherein said second metal layer covers said top and sidewalls;

heating said metal and silicon to form a nonsilicidized metal over a strip of metal silicide; and removing said nonsilicidized metal.

2. The process of claim 1 further comprising:

forming a layer of oxide on said silicon prior to masking and etching;

wherein said metal silicide strip includes an oxide cap.

3. The process of claim 1 wherein said dielectric insulator comprises field oxide.

4. The process of claim 1 wherein said nonsilicidized metal is a metal nitride or nonreacted metal.

5. The process of claim 1 wherein said removing step includes a selective etch of said nonsilicidized metal.

6. The process of claim 1 wherein said metal is a transition metal.

7. The process of claim 6 wherein said transition metal is titanium, cobalt, platinum, palladium, molybdenum, tantalum or nickel.

8. A process for forming a metal silicide local interconnect between contact points separated by a dielectric insulator on an integrated circuit comprising:

forming a first layer of metal on said insulator;

forming a layer of silicon on said metal;

masking and etching said silicon layer to form a silicon strip connecting said contact points;

forming an overlying second layer of metal;

heating said metal and silicon to form a nonsilicidized metal over a strip of metal silicide; and removing said nonsilicidized metal;

wherein said first layer of metal is formed into a layered strip with said silicon strip during said masking and etching step.

9. The process of claim 8 wherein said layered strip includes a top and substantially vertical sidewalls and wherein said second metal layer covers said top and sidewalls.

10. A process for forming a titanium silicide local interconnect between contact points separated by a dielectric insulator on an integrated circuit comprising:

forming a first layer of titanium on said insulator;

forming a layer of silicon on said titanium;

masking and etching said silicon layer to form a silicon strip connecting said contact points, wherein said silicon strip includes a top and sidewalls;

forming a second layer of titanium on said top and sidewalls of said silicon strip;

heating said second titanium layer and silicon strip to form a titanium nitride coating over a strip of titanium silicide;

removing said coating by a selective etch; and forming a glass layer over said titanium silicide strip.

11. The process of claim 10 further comprising:

reheating said titanium silicide strip after removing said coating to a temperature greater than the temperature of said heating step.

12. The process of claim 11 further comprising:

providing an overlying metalization layer with a contact to said titanium silicide through an opening in said glass.

13. The process of claim 10 further comprising:

forming a layer of oxide on said silicon prior to masking and etching said silicon layer;

wherein said silicon strip includes an oxide cap.

14. The process of claim 13 further comprising:

reheating said oxide capped, titanium silicide strip after removing said coating to a temperature greater than the temperature of said heating step.

15. The process of claim 14 further comprising:

providing an overlying metalization layer with a contact to said titanium silicide through an opening in said glass and oxide cap.

16. The process of claim 10 further comprising:

covering said layer of silicon and said contact points and dielectric insulator with a layer of oxide.

17. A process for forming a titanium silicide local interconnect between contact points separated by a dielectric insulator on an integrated circuit comprising:

forming a first layer of titanium on said insulator;

forming a layer of silicon on said titanium;

masking and etching said silicon layer to form a silicon strip connecting said contact points, wherein said silicon strip includes a top and sidewalls;

forming a second layer of titanium on said top and sidewalls of said silicon strip;

heating said second titanium layer and silicon strip to form a titanium nitride coating over a strip of titanium silicide;

removing said coating by a selective etch; and forming a glass layer over said titanium silicide strip;

wherein said first layer of titanium is formed into a layered strip with said silicon strip during said masking and etching step.

18. The process of claim 17 further comprising:

reheating said titanium silicide strip after removing said coating to a temperature greater than the temperature of said heating step.

19. The process of claim 18 further comprising:

providing an overlying metalization layer with a contact to said titanium silicide through an opening in said glass.

20. A process for forming a titanium silicide local interconnect between contact points separated by a dielectric insulator on an integrated circuit comprising:

forming a first layer of titanium on said insulator;

forming a layer of silicon on said titanium;

masking and etching said silicon layer to form a silicon strip connecting said contact points, wherein said silicon strip includes a top and sidewalls;

forming a second layer of titanium on said top and sidewalls of said silicon strip;

heating said second titanium layer and silicon strip to form a titanium nitride coating over a strip of titanium silicide;

removing said coating by a selective etch; and forming a glass layer over said titanium silicide strip;

forming a layer of oxide on said silicon prior to masking and etching said silicon layer;

wherein said silicon strip includes an oxide cap; and wherein said first layer of titanium is formed into a layered strip with said oxide capped, silicon strip during said masking and etching step.

21. The process of claim 20 further comprising:

reheating said oxide capped, titanium silicide strip after removing said coating to a temperature greater than the temperature of said heating step.

22. The process of claim 21 further comprising:

providing an overlying metalization layer with a contact to said titanium silicide through an opening in said glass and oxide cap.

23. A process for forming a metal silicide strip on an integrated circuit having a plurality of source and drain regions, comprising:

forming a silicon strip overlying first metal, wherein said silicon strip includes a top and substantially vertical sidewalls;

coating said silicon strip including said top and substantially vertical sidewalls with second metal; and heating the coated strip to form metal silicide within at least one of the plurality of source and drain regions.

24. A process for forming a metal silicide strip on an integrated circuit having a plurality of source and drain regions, comprising:

forming a silicon strip overlying first metal;

coating said silicon strip with second metal; and heating the coated strip to form metal silicide within at least one of the plurality of source and drain regions, wherein said first metal is formed into a layered strip with said silicon strip during said forming step.

25. A process for forming a metal silicide strip on an integrated circuit comprising:

forming an oxide capped silicon strip overlying first metal, wherein said silicon strip includes a top and substantially vertical sidewalls;

coating said oxide capped silicon strip with second metal, wherein said second metal layer covers said sidewalls;

heating the coated strip to form an oxide capped metal silicide strip coated with nonsilicidized metal; and removing said nonsilicidized metal.

26. A process for forming a metal silicide strip on an integrated circuit comprising:

forming an oxide capped silicon strip overlying first metal;

coating said oxide capped silicon strip with second metal;

heating the coated strip to form an oxide capped metal silicide strip coated with nonsilicidized metal; and removing said nonsilicidized metal;

wherein said first metal is formed into a layered strip with said oxide capped silicon strip during said forming step.

27. In the manufacture of an electronic integrated circuit, a process for forming a local interconnect between contact points comprising the following steps:

forming a strip of silicon upon a metal, which strip includes a top and substantially vertical sidewalls and extends between the contact points;

applying a barrier metal to protect both the silicon strip, including the top and substantially vertical sidewalls, and the metal from ambient gases;

heating the silicon strip, the metal, and the barrier metal so that the silicon, the barrier metal and the metal form a silicide for use in said local interconnect.

* * * * *